United States Patent [19]

Kainoh

[11] Patent Number: 5,098,802
[45] Date of Patent: Mar. 24, 1992

[54] BATTERY TERMINAL DEVICE

[75] Inventor: Seio Kainoh, Yamato-Takada, Japan

[73] Assignee: Sharp Kabushiki Kaisha, Osaka, Japan

[21] Appl. No.: 562,194

[22] Filed: Aug. 3, 1990

[30] Foreign Application Priority Data

Aug. 9, 1989 [JP] Japan .................. 1-93607[U]

[51] Int. Cl.⁵ .............................................. H01M 2/30
[52] U.S. Cl. ................................... 429/178; 429/122; 429/211
[58] Field of Search ............... 429/178, 211, 121, 122; 439/500, 883, 884; 361/397, 404

[56] References Cited

U.S. PATENT DOCUMENTS

| | | | |
|---|---|---|---|
| 2,216,666 | 10/1940 | Hempel | 429/121 X |
| 3,513,034 | 5/1970 | Fischbach et al. | 429/211 |
| 3,607,432 | 9/1971 | Johnson | 429/211 |
| 3,960,603 | 6/1976 | Morioka et al. | 429/211 X |
| 4,452,869 | 6/1984 | De Moully et al. | 429/178 X |
| 4,554,227 | 11/1985 | Takagaki et al. | 429/178 |

FOREIGN PATENT DOCUMENTS

| | | | |
|---|---|---|---|
| 2239020 | 2/1975 | France | 429/211 |
| 57-14966 | 1/1982 | Japan . | |
| 60-31067 | 3/1985 | Japan . | |
| 63-129964 | 8/1988 | Japan . | |
| 80963 | 6/1990 | Japan . | |

Primary Examiner—Anthony Skapars
Attorney, Agent, or Firm—David G. Conlin; Henry D. Pahl, Jr.

[57] ABSTRACT

A battery terminal device to be connected to a first pole and a second pole of a battery includes a first connection member which is capable of being electrically connected to the first pole of the battery, a second connection member which is capable of being electrically connected to the second pole of the battery, a first strip member which is capable of being fixed at one end portion by solder to a first wiring pattern section disposed on a printed wiring board, and which is conductively coupled at the other end portion to the first connection member and has a plurality of through holes along the longitudinal direction, and a second strip member which is capable of being fixed at one end portion by solder to a second wiring pattern section disposed on a printed wiring board, and which is conductively coupled at the other end portion to the second connection member and has a plurality of through holes along the longitudinal direction.

11 Claims, 3 Drawing Sheets

BATTERY TERMINAL DEVICE

BACKGROUND OF THE INVENTION

1. Field of the Invention

The present invention relates to a battery terminal device to be connected to a battery.

2. Description of the Related Art

A battery terminal device is used to be connected to a first pole and a second pole of the button type batteries, such as lithium batteries, used as power sources in small electronic apparatuses like electronic calculators and electronic notebooks.

The battery terminal device generally has a positive-side connection member and a negative-side connection member capable of being electrically connected to the positive pole and the negative pole of the battery, respectively. The battery terminal device generally also has a positive-side strip member and a negative-side strip member capable of being fixed, respectively, by solder to a positive-side wiring pattern section and a negative-side wiring pattern section which are disposed on a printed wiring board. The positive-side strip member is conductively coupled to the positive-side connection member, and the negative-side strip member is also conductively coupled to the negative-side connection member. Accordingly, the battery terminal device is constructed so that the button type battery can be electrically connected to the positive-side and the negative-side connection members.

However, when the positive-side strip member and the negative-side strip member are soldered to the positive-side and the negative-side wiring pattern sections, respectively, in a small electronic apparatus in which this type of battery terminal device is used, it is extremely difficult to solder these positive-side and negative-side strip members to the positive-side and the negative-side wiring pattern sections respectively in a stationary state so that the positive-side and negative-side strip members do not slip from the outside of the positive-side and negative-side wiring pattern sections, respectively.

The reason why it is extremely difficult to solder, as described above, is that each area of the positive-side and the negative-side wiring pattern sections on which solder is to be applied is limited. An inconvenience with an electrical short-circuit arises when any of the fixation sections of the positive-side and the negative-side strip members slip from the positive-side and the negative-side wiring pattern sections, respectively. Also, more solder must be applied in order to reliably fix the positive-side and the negative-side strip members to the positive-side and negative-side wiring pattern sections, respectively. In such a case, each area of the positive-side and negative- o side wiring pattern sections on which the solder is to be applied must be made larger, resulting in the battery terminal device becoming larger. In addition, generally, the shape of the battery terminal device differs depending on the differences in the construction of electronic apparatuses and on the kinds of button type batteries. Therefore, a metallic mold is required to newly manufacture battery terminal devices having shapes suited to that of batteries to be connected, and the costs will be increased.

SUMMARY OF THE INVENTION

It is therefore an object of the present invention to provide a battery terminal device to be connected to a first-pole and a second pole of a battery without moving loosely when the battery terminal device are soldered to a first and a second wiring pattern sections, respectively.

Another object of the present invention is to provide a battery terminal device is which solder is sufficiently applied so as to be reliably fixed, as well as a device that is smaller.

A further object of the present invention is to provide a battery terminal device capable of being embodied in various battery shapes.

According to the present invention, the abovedescribed objects are attained by a battery terminal device to be connected to a first pole and a second pole of a battery including a first connection member which is capable of being electrically connected to the first pole of the battery, a second connection member which is capable of being electrically connected to the second pole of the battery, a first strip member which is capable of being fixed at one end portion by solder to a first wiring pattern section disposed on a printed wiring board, and which is conductively coupled at the other end portion to the first connection member and has a plurality of through holes along the longitudinal direction, and a second strip member which is capable of being fixed at one end portion by solder to a second wiring pattern section disposed on a printed wiring board, and which is conductively coupled at the other end portion to the second connection member and has a plurality of through holes along the longitudinal direction.

Any through hole from among a plurality of through holes disposed on each of the first and the second strip members can be used for the fixation of the battery terminal device by soldering. Accordingly, the first and the second strip members will not get out of the predetermined positions on the first and the second wiring pattern sections, respectively. Since a lot of solder enter the through holes and is applied to the wiring pattern sections, the first and the second strip members can be strongly fixed to the first and the second wiring pattern sections, respectively, so it is not necessary to make the area of the wiring pattern sections larger. Further, by cutting the strip members to a desired length, it can be used in various battery shapes and it is very economical. The use of the present invention, in particular, in small and thin electronic apparatuses enables remarkable effects to be obtained.

Further objects and advantages of the present invention will be apparent from the following description of the preferred embodiments of the invention as illustrated in the accompanying drawings.

BRIEF DESCRIPTION OF THE DRAWINGS

FIG. 6 shows a perspective illustrating the construction of an electronic apparatus which has a battery terminal device built-in.

DESCRIPTION OF THE PREFERRED EMBODIMENTS

Figure 1:
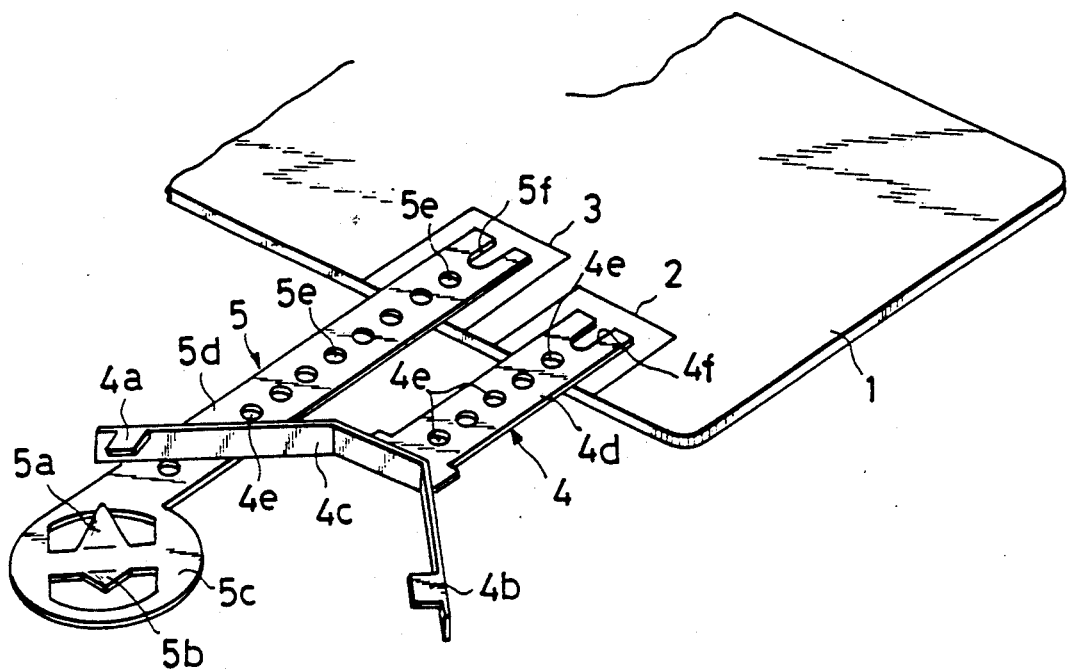
FIG. 1 shows a perspective view illustrating the construction of a battery terminal device before it is assembled by soldering in a preferred embodiment of the battery terminal device of the present invention.

FIG. 1 shows a perspective view illustrating the construction of a battery terminal device before it is assembled by soldering in a preferred embodiment of a battery terminal device of the present invention. In FIG. 1, a first rectangular wiring pattern section 2 and a second rectangular wiring pattern section 3, small in area, are each formed on the ends of a printed wiring board 1. A first terminal 4 is integrally formed in an electrically conducting state by a pair of first hold members 4a and 4b capable of holding a battery, a first connection member 4c capable of being electrically connected to the first pole of the battery, and a first strip member 4d capable of being fixed by solder to the first wiring pattern section 2. The first hold members 4a and 4b project from the tops of both ends of the first connection member 4c in a direction intersecting at right angles. The first connection member 4c is formed to be bent at right angles to the first strip member 4d, and is formed substantially in the form of the letter V. The first strip member 4d is extendedly disposed from the center bottom of the first connection member 4c in a direction perpendicularly intersecting the first connection member 4c. A plurality of through holes 4e are disposed at equal intervals in the first strip member 4d. A U-shaped notch 4f is formed in the end of the first strip member 4d.

A second terminal 5 is integrally formed in an electrically conducting state by a pair of second hold members 5a and 5b capable of holding a battery, a second connection member 5c capable of being electrically connected to a second pole of the battery, and a second strip member 5d capable of being fixed by solder to the second wiring pattern section 3. The second connection member 5c is formed in a disc-like shape. The second hold members 5a and 5b are formed in such a way that they are cut and made to rise from the second connection member 5c. The second strip member 5d is extendedly disposed from the second connection member 5c. A plurality of through holes 5e are disposed at equal intervals in the second strip member 5d. A U-shaped notch 5f is formed in the end of the second strip member 5d. Regarding the first terminal 4 and the second terminal 5, the first and the second strip members 4d and 5d can be positioned and soldered on the first and the second wiring pattern sections 2 and 3, respectively. Accordingly, the battery terminal device is constructed so that the first and the second poles of the battery can be electrically connected to the first and the second connection members, respectively.

The procedure of assembling the battery terminal device by soldering in this embodiment will be explained hereinunder.

As shown in FIG. 1, when the first and the second terminals 4 and 5 are soldered to the first and the second wiring pattern sections 2 and 3, respectively, the ends of the first and the second strip members 4d and 5d are placed on the first and the second wiring pattern sections 2 and 3, respectively, and their positions are determined. Then, soldering is performed. This soldering is performed similarly for the first and the second terminals 4 and 5, so the case of the second terminal 5 will be explained in this embodiment.

Figure 2:
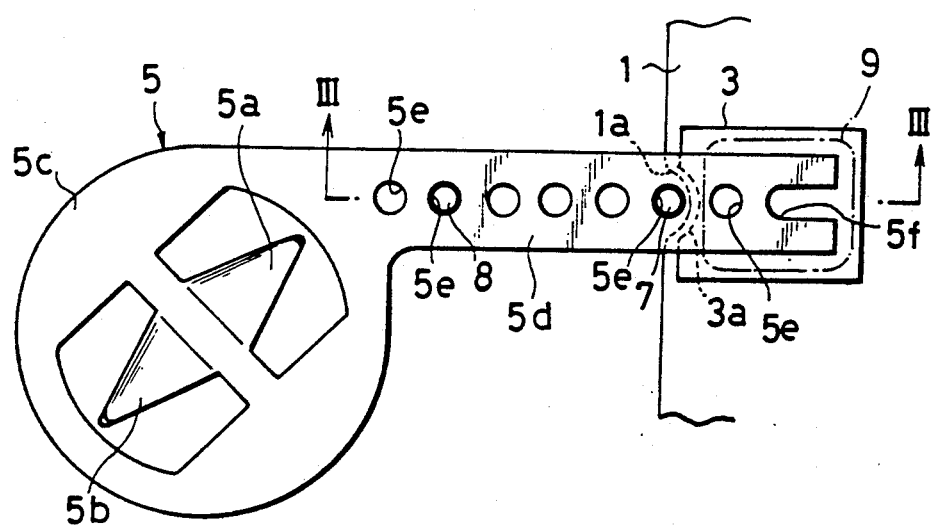
FIG. 2 shows a top plan view illustrating a portion of the battery terminal device after it is assembled by soldering in the embodiment in FIG. 1.

FIG. 2 shows a top plan view illustrating a portion of the battery terminal device after it is assembled by soldering in the embodiment in FIG. 1.

Figure 3:
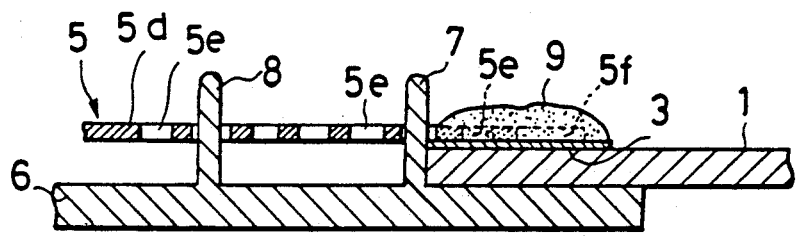
FIG. 3 shows a cross sectional view taken along the line III—III in FIG. 2.

FIG. 3 shows a cross sectional view taken along the line III—III in FIG. 2.

As shown in FIG. 2 and FIG. 3, a fixing instrument 6 has positioning pins 7 and 8. The positioning pins 7 and 8 are inserted into and made to pass through the corresponding through holes 5e, so that the fixing instrument is joined to the bottom surface of the printed wiring board 1. Curved sections 1a and 3a are formed in the printed wiring board 1 and the second wiring pattern section 3, respectively. The position of the fixing instrument 6 is determined by bringing one of the positioning pins 7 and 8 into contact with the curved section 1a.

In this state, soldering is performed. That is, the second terminal 5 is held in a positioned state without moving loosely by means of positioning pins 7 and 8 inserted into and made to pass through the through holes 5e. Since solder 9 enters the through holes 5e and the U-shaped notch 5f, the amount of the solder 9 included in the portion where the second strip member 5d and the second wiring pattern section 3 are joined becomes larger than the case in which the through holes 5e and the U-shape notch 5f are not formed in the second strip member 5d. Similar soldering is performed in the first terminal 4.

The adjustment of the length of the strip members of the battery terminal device in this embodiment will be explained hereinunder. The adjustment of the length of the strip members is performed basically similarly for the first and the second terminals 4 and 5, so an explanation will be given of the second terminal 5 in this embodiment.

Figure 4:
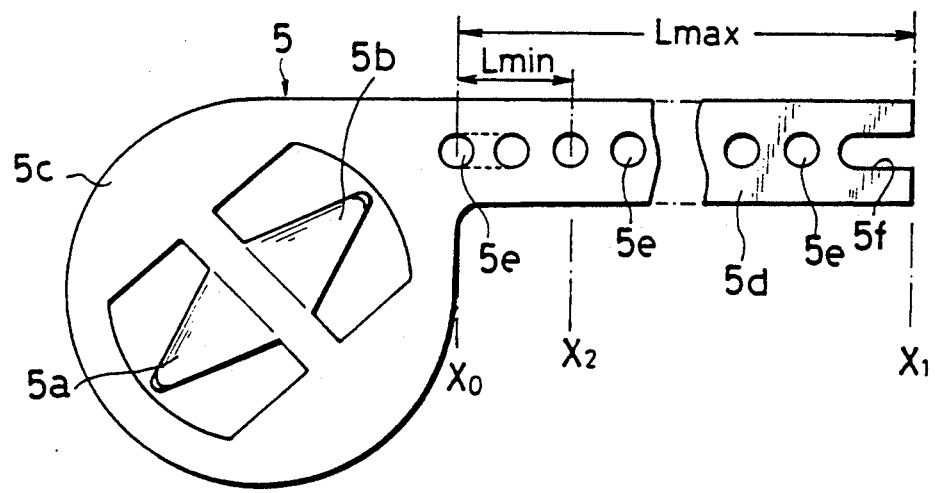
FIG. 4 shows a top plan view of a second terminal in the embodiment in FIG. 1.

FIG. 4 shows a top plan view of a second terminal in the embodiment in FIG. 1. In FIG. 4, $X_0$ passes through the center of the through hole 5e which is closest to the second connection member 5c, and $X_0$ lies at a position in the longitudinal direction of the second strip member 5d of the cutting line extending in the transverse direction of the second strip member 5d. $X_1$ lies at a position in the longitudinal direction of the second strip member 5d being uncut, with $X_0$ as a reference, which is equivalent to the position in the case where the second strip member 5d of the maximum length $L_{max}(X_1-X_0)$ up to the end of the second strip member 5d is used. $X_2$ passes through the center of the through hole 5e which is the third from the second connection member 5c, and $X_2$ lies at a position in the longitudinal direction of the second strip member 5d of the cutting line in the transverse direction of the second strip member 5d, which is equivalent to the position in the case where the second strip member 5d of the minimum length $L_{min}(X_2-X_0)$ up to the cutting section cut along the cutting line is used. The adjustment of the length of the second strip member 5d can be made by cutting the second strip member 5d along the cutting line passing through the center of any through hole 5e in the section from $X_1$ to $X_2$ and in the transverse direction of the second strip member 5d.

Figure 5:
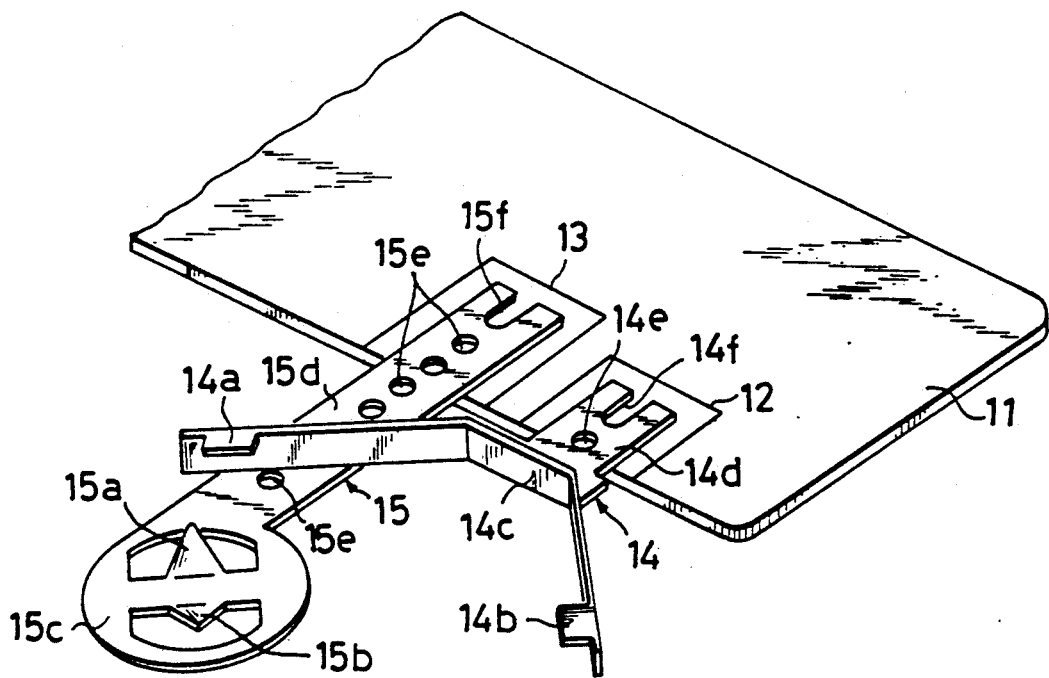
FIG. 5 shows a perspective view illustrating the construction of the battery terminal device before it is soldered in another preferred embodiment of the present invention.

FIG. 5 shows a perspective view illustrating the construction of the battery terminal device before it is soldered in another preferred embodiment of the present invention. The construction of the battery terminal device shown in FIG. 5 in another embodiment is the same as that of the above-mentioned battery terminal device shown in FIG. 1 in a preferred embodiment of the present invention. That is, a first rectangular wiring pattern section 12 and a second rectangular wiring pattern section 13, small in area, are each formed on the ends of a printed wiring board 11. A first terminal 14 is integrally formed in an electrically conducting state by a pair of first hold members 14a and 14b capable of holding a battery, a first connection member 14c capable of being electrically connected to a first pole of the battery, and a first strip member 14d capable of being fixed by solder to the first wiring pattern section 12. The first hold members 14a and 14b project from the tops of both ends of the first connection member 14c in a direction intersecting at right angles. The first connection member 14c is formed to be bent at right angles to the first strip member 14d, and is formed substantially in the form of the letter V. The first strip member 14d is extendedly disposed from the center bottom of the first connection member 14c in a direction perpendicularly intersecting the first connection member 14c. A plurality of through holes 14e are disposed at equal intervals on the first strip member 14d. A U-shaped notch 14f is formed in the end of the first strip member 14d.

A second terminal 15 is integrally formed in an electrically conducting state by a pair of second hold members 15a and 15b capable of holding a battery, a second connection member 15c capable of being electrically connected to a second pole of the battery, and a second strip member 15d capable of being fixed by solder to the second wiring pattern section 13. The second connection member 15c is formed in a disc-like shape. The second hold members 15a and 15b are formed in such a way that they are cut and made to rise from the second connection member 15c. The second strip member 15d is extendedly disposed from the second connection member 15c. A plurality of through holes 15e are disposed at equal intervals on the second strip member 15d. A U-shaped notch 15f is formed in the end of the second strip member 15d.

In FIG. 5, the length of the first strip member 14d is the above-mentioned minimum length $L_{min}$, and the length of the second strip member 15d is slightly shorter than the length of the second strip member 5d shown in FIG. 1.

The adjustment of the length of the second strip member 15d regarding the second terminal 15 will be explained hereinunder.

One of through holes 15e is cut along the cutting line which passes through the center itself in the transverse direction of the second strip member 15d. A cutout is made along the two lines (corresponding to the broken lines shown in FIG. 4), in the longitudinal direction of the second strip member 15d, tangent to the above through hole 15e and the other through hole 15e adjacent to the former hole. A U-shaped notch 15f is formed by removing the portion between the two tangent lines. This U-shaped notch 15f is not necessarily formed. Even if soldering is performed in a state in which the second strip member 15d is only cut along the cutting line passing through the center of the through hole 15e, solder which is not shown in FIG. 5 can enter a semicircular notch formed by the cutting of the through notch. A basically similar adjustment of the length of the first strip member 14d can be performed for the first terminal 14.

The embodiment of a battery terminal device was explained hereinabove. The battery terminal device of the present invention can be connected to the first and the second poles of button type batteries, such as lithium batteries, used as power sources in small electronic apparatuses like electronic calculators and electronic notebooks.

Figure 6:
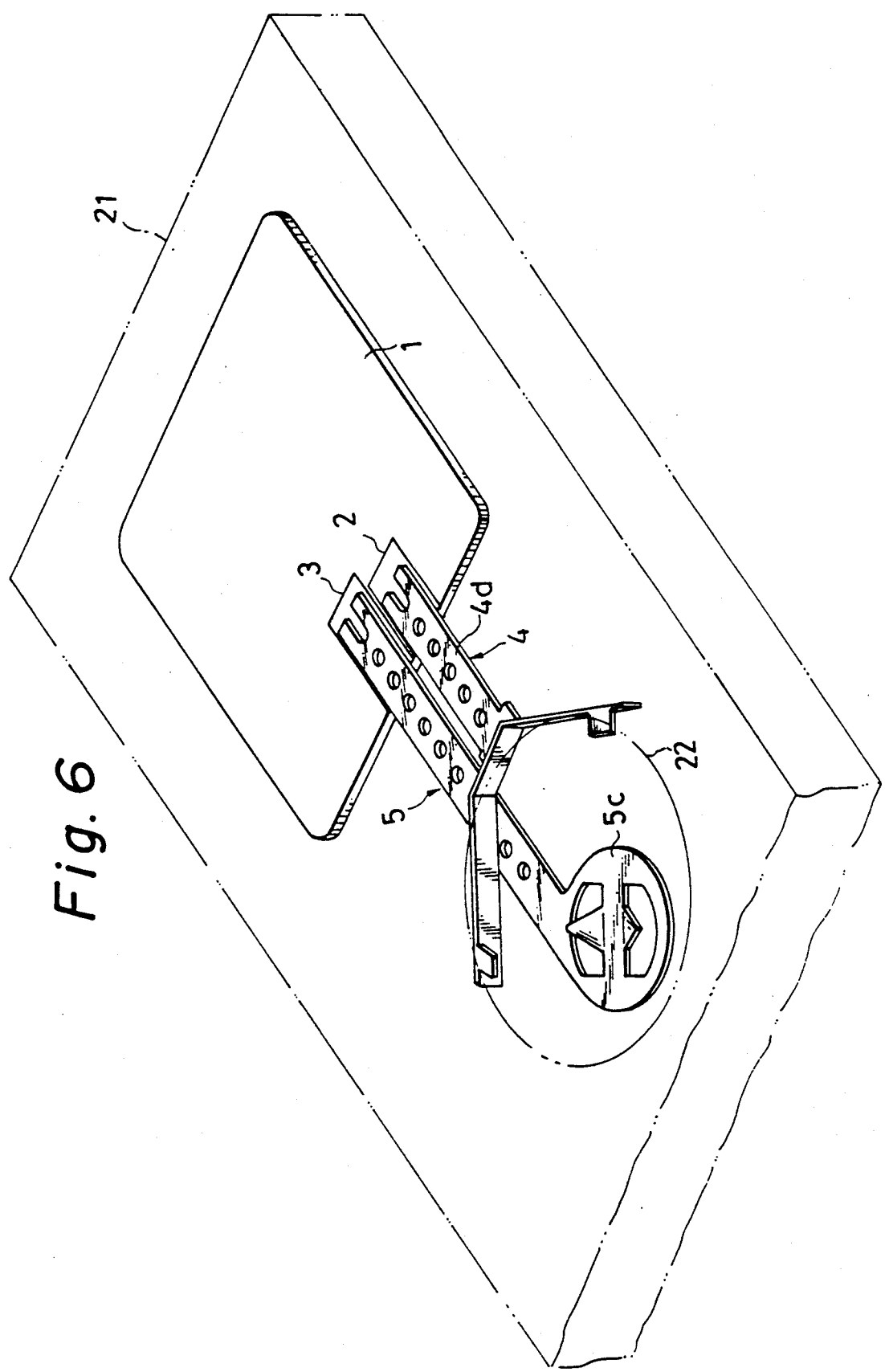

FIG. 6 shows a perspective view illustrating the construction of an electronic apparatus which has a battery terminal device built-in. In FIG. 6, the same numerals denotes the same elements as shown in FIG. 1. An electronic apparatus 21 is, for example, an electronic calculator and an electronic notebook An electronic apparatus 21 has the battery terminal device of the present invention built-in. In this example of the electronic apparatus 21, a button type battery can be set at a portion 22. A first and a second pole of the battery can be connected to the first and the second terminals 4 and 5. In addition, in FIG. 1 and FIG. 5, the second connection members 5c and 15c are not positioned on an extended portion of the first strip members 4d and 14d, respectively, for the convenience of the explanation. In actual, the construction of the battery terminal device can be made so that the second connection member 5c are placed on an extended portion of the first strip members 4d as shown in FIG. 6.

Many widely different embodiments of the present invention may be constructed without departing from the spirit and scope of the present invention. It should be understood that the present invention is not limited to the specific embodiments described in this specification, except as defined in the appended claims.

What is claimed is:

1. A battery terminal device for connecting a first pole and a second pole of a battery to a first wiring pattern section and a second wiring pattern section disposed on a printed wiring board, respectively, comprising:

a first contacting member for electrically contacting in the first pole of the battery;

a second contacting member for electrically contacting to the second pole of the battery;

a first elongate strip member being coupled integrally with said first contacting member at one end portion thereof and having a single line of first through holes extending in alignment with the longitudinal direction of the strip, at least one of said first through holes being disposed in the other end portion of said first strip member for fixing said first strip member to the first wiring pattern section by soldering; and a second elongate strip member being coupled integrally with said second contacting member at one end portion thereof and having a single line of second through holes extending in alignment with the longitudinal direction of said second strip, at least one of said second through holes being disposed in the other end portion of said second strip member for fixing said second strip member to the second wiring pattern section by soldering.

2. A battery terminal device as claimed in claim 1, wherein said first contacting member is formed to be bent at right angles to said first strip member, and is formed substantially in the form of the letter V.

3. A battery terminal device as claimed in claim 2, wherein said first contacting member has a center bottom, and wherein said first strip member is extendedly disposed from the center bottom of said first contacting member in the direction perpendicularly intersecting said first contacting member.

4. A battery terminal device as claimed in claim 1, wherein a U-shaped notch is formed in the end of said first strip member at which solder is to be applied.

5. A battery terminal device as claimed in claim 1, wherein said second contacting member is formed in a disc-like shape.

6. A battery terminal device as claimed in claim 5, wherein said second strip member is extendedly disposed from said second contacting member.

7. A battery terminal device as claimed in claim 1, wherein a U-shaped notch is formed in the end of said second strip member at which solder is to be applied.

8. A battery terminal device as claimed in claim 1, wherein said device is constructed so that the length of said first strip member and said second strip member can be adjusted by cutting said first strip member and said second strip member, respectively along the cutting line passing through the center of any through hole from among said first through holes and said second through holes, and in the transverse direction of said first strip member and said second strip member, respectively.

9. An electronic apparatus in which a battery with a first pole and a second pole is used, comprising:
   a printed wiring board; and
   a battery terminal device to be connected to a first pole and a second pole of a battery, including
   a first connection member capable of being electrically connected to the first pole of the battery,
   a second connection member capable of being electrically connected to the second pole of the battery;
   a first strip member capable of being fixed at one end portion by solder to a first wiring pattern section disposed on a printed wiring board, said first strip member being conductively coupled at the other end portion to said first connection member and having a plurality of through holes along the longitudinal direction, and
   a second strip member capable of being fixed at one end portion by solder to a second wiring pattern section disposed on the printed wiring board, said second strip member being conductively coupled at the other end portion to said second connection member and having a plurality of through holes along the longitudinal direction.

10. A battery terminal device to be connected to a first pole and a second pole of a battery, comprising:
   a first connection member capable of being electrically connected to the first pole of the battery;
   a second connection member capable of being electrically connected to the second pole of the battery;
   a first strip member capable of being fixed at one end portion by solder to a first wiring pattern section disposed on a printed wiring board, said first strip member being conductively coupled at the other end portion to said first connection member and having a plurality of through holes along the longitudinal direction, said first connection member being bent at right angles to said first strip member and being formed substantially in the form of the letter V, said first connection member including two hold members capable of holding the battery, said hold members being formed to project from the tops of both ends of said V-formed first connection member in such manner as to intersect at right angle; and
   a second strip member capable of being fixed at one end portion by solder to a second wiring pattern section disposed on a printed wiring board, said second strip member being conductively coupled at the other end portion to said second connection member and having a plurality of through holes along the longitudinal direction.

11. A battery terminal device to be connected to a first pole and a second pole of a battery, comprising:
   a first connection member capable of being electrically connected to the first pole of the battery;
   a second connection member capable of being electrically connected to the second pole of the battery;
   a first strip member capable of being fixed at one end portion by solder to a first wiring pattern section disposed on a printed wiring board, said first strip member being conductively coupled at the other end portion to said first connection member and having a plurality of through holes along the longitudinal direction; and
   a second strip member capable of being fixed at one end portion by solder to a second wiring pattern section disposed on a printed wiring board, said second strip member being conductively coupled at the other end portion to said second connection member and having a plurality of through holes along the longitudinal direction, said second connection member being formed in a disc-like shape.

* * * * *